United States Patent
Adams et al.

[11] Patent Number: 6,081,361
[45] Date of Patent: Jun. 27, 2000

[54] SUB-CARRIER MULTIPLEXING IN BROADBAND OPTICAL NETWORKS

[75] Inventors: Laura Ellen Adams, Basking Ridge; Clyde George Bethea, Franklin, both of N.J.; Gerald Nykolak, Long Beach Long Island, N.Y.; Roosevelt People, Plainfield; Tawee Tanbun-Ek, Califon, both of N.J.

[73] Assignee: Lucent Technologies Inc., Murray Hill, N.J.

[21] Appl. No.: 08/954,575

[22] Filed: Oct. 17, 1997

[51] Int. Cl.[7] .......................... H04B 10/01; H04B 10/04; H04B 10/12; H01S 3/08

[52] U.S. Cl. .......................... 359/188; 359/188; 359/181; 359/173; 372/96; 385/14

[58] Field of Search .................... 359/180, 181, 359/188, 173; 372/96; 385/14

[56] References Cited

U.S. PATENT DOCUMENTS

| | | | |
|---|---|---|---|
| 5,477,368 | 12/1995 | Eskildsen et al. | 359/188 |
| 5,606,573 | 2/1997 | Tsang | 372/96 |
| 5,777,773 | 7/1998 | Epworth et al. | 359/182 |

FOREIGN PATENT DOCUMENTS

| | | | |
|---|---|---|---|
| 475331A2 | 3/1992 | European Pat. Off. | H04J 14/02 |
| 660546A1 | 6/1995 | European Pat. Off. | H04B 7/26 |
| 762577A1 | 3/1997 | European Pat. Off. | H01S 3/103 |
| 788252A2 | 8/1997 | European Pat. Off. | H04J 14/02 |
| 057286A | 3/1991 | Japan | H01S 3/18 |

OTHER PUBLICATIONS

N. K. Shankaranarayanan et al., WDMA/Subcarrier–FDMA Lightwave Networks . . . , J. Lightwave Technology, vol. 9, No. 7, pp. 931–943 (1991).

T. Tanbun–Ek et al., Broad–Band Tunable Electroabsorption . . . , IEEE J. of Selected Topics in Qunatum Electr., vol. 3, No. 3, pp. 960–966 (Jun. 1997).

T. Numai, 1.5–$\mu$m Wavelength Tunable Phase–shift Controlled Distributed Feedback Laser, J. Lightwave Tech., vol. 10, No. 2, pp. 199–205 (1992).

W.T. Tsang et al., Control of Lasing Wavelength in Distributed Feedback Lasers by Angling the Active Stripe with Respect to the Grating, IEEE Photonics Tech. Lett., vol. 5, No. 9, pp. 978–980 (1993).

H. Nakajima et al., Absorption–controlled tunable DFB amplifier–filters, Electronic Lett., vol. 30, No. 16, pp. 1294–1296 (1994).

H. Hillmer et al., Tailored DFB Laser Properties by Individually Chirped Gratings Using Bent Waveguides, IEEE J. Selected Topics in Quantum Electronics, vol. 1, No. 2, pp. 356–362 (1995).

H. Nakajima et al., Very high speed wavelength switching capability Franz–Keldysh electroabsorption DFB lasers, OFC '96 Technical Digest, p. 276 (1996).

(List continued on next page.)

Primary Examiner—Jason Chan
Assistant Examiner—Mohammad Sedighian
Attorney, Agent, or Firm—Michael J. Urbano

[57] ABSTRACT

In a WDM fiber-optic network, a unique laser transmitter enables signals to be routed at three hierarchical levels: at one level discrimination among signal paths is based on N WDM wavelength channels, at another level discrimination is based on m AM subcarrier frequency channels, and at a third level discrimination is based on n FM subcarrier frequency channels. Thus, a total of Nmn distinguishable optical channels can be accommodated and a like number of users served. The laser transmitter comprises a broadband, tunable semiconductor laser which includes an intracavity, integrated composite reflector to which a tuning voltage and a FM dither signal are applied, an intracavity gain section to which drive current is applied, and an extracavity, integrated electroabsorption modulator to which an information (e.g., data, voice, video) signal and an AM dither signal are applied. The tuning voltage provides coarse wavelength tuning among N WDM channels, whereas the FM dither signal produces an additional m channels via FM-SCM. The AM dither likewise produces an additional n channels via AM-SCM.

18 Claims, 3 Drawing Sheets

OTHER PUBLICATIONS

L. E. Adams et al., System Performance of High–Speed Broadband–Tunable Laser for Wavelength Conversion in WDM Networks, OFC '97, Postdeadline Paper No. PD11, pp. 1–4 (1997).

T. Tanbun–Ek et al., Tunable Electroabsorption Modulated Laser Integrated with a Bent Waveguide Distributed–Feedback Laser, IEEE Photonics Tech. Lett., vol. 9, No. 5, pp. 563–565(1997).

N. K. Shankaranarayanan et al., WDMA/Subcarrier–FDMA Lightwave Networks . . . , J. Lightwave Technology, vol. 9, No. 7, pp. 931–943 (1991).

M. Shell et al., Experimental Demonstration of All–Optical Routing Node . . . , IEEE Photonics Technology Letters, vol. 8, No. 10, pp. 1391–1393 (Oct. 1996).

W. I. Way et al., 160–Channel FM–Video Transmission Using Optical FM/FDM . . . , Electronics Letters, vol. 26, No. 2, pp. 139–142 (1990).

T. Uno et al., Low–distortion characteristics . . . WDM AM SCM transmission, OFC '94 Technical Digest, Paper WM2, pp. 153–155 (1994).

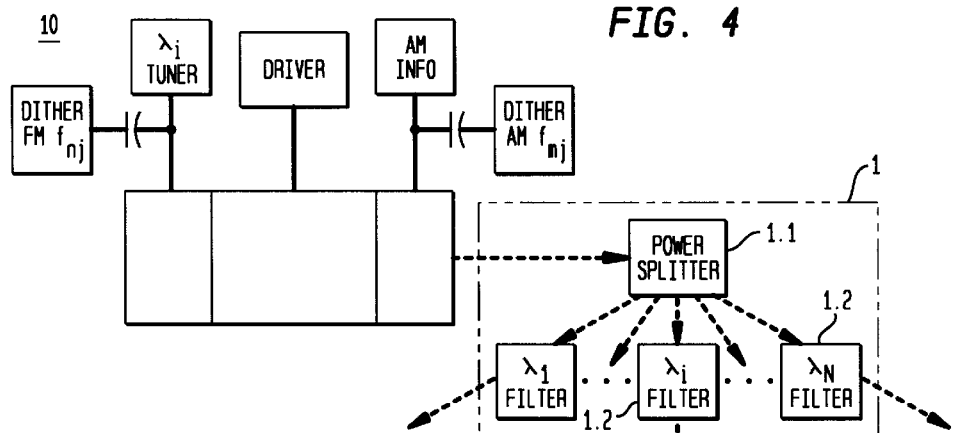
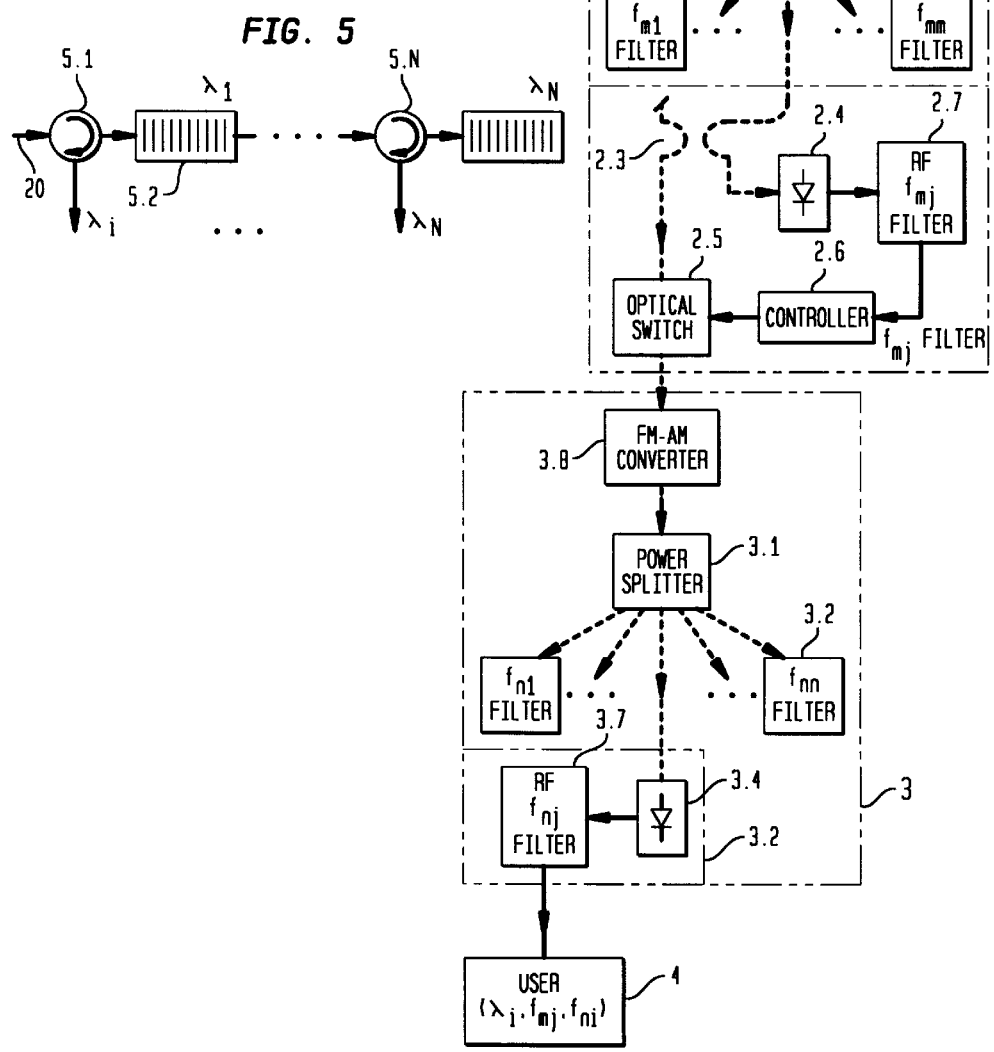
FIG. 4
FIG. 5

SUB-CARRIER MULTIPLEXING IN BROADBAND OPTICAL NETWORKS

CROSS-REFERENCE TO RELATED APPLICATIONS

This application was concurrently filed with application Ser. No. 08/954,305 entitled Broadband Tunable Semiconductor Laser Source (Adams 1-16-1-6-5-2-11-57), with application Ser. No. 08/954,022 entitled Laser Transmitter for Reduced Signal Distortion (Adams 3-18-8-7-13), and with application Ser. No. 08/954,576 entitled Laser Transmitter for Reduced SBS (Adams 4-19-7-9-8-14).

FIELD OF THE INVENTION

This invention relates generally to broadband optical networks and, more particularly, to broadband, tunable, semiconductor laser transmitters which enable subcarrier multiplexing (SCM).

BACKGROUND OF THE INVENTION

In optical networks, laser sources are typically utilized to generate carrier signals on which information (e.g., data, voice, video) is impressed by some suitable modulation scheme. In wavelength division multiplexed (WDM) systems a plurality of lasers, or a broadband tunable laser, generates a plurality of carriers at different wavelengths corresponding to the different channels of the system. As optical networks become more prevalent and sophisticated, particularly in multi-access networks, there will likely be a need for more functionality in the laser sources. As service demands grow, technologies will be needed to increase the capacity of these networks to accommodate a larger number of users. Additional signal routing capability on the physical layer may be required to provide additional networking capabilities.

The prior art has endeavored to increase the capacity of optical WDM networks by resorting to SCM. Most have proposed frequency modulation subcarrier schemes known as FM-SCM. See, for example, W. I. Wang et al., *Electronics Letters*, Vol. 26, No. 2, pp. 139–142 (1990), N. K. Shankaranarayanan et al., *J. Lightwave Technology*, Vol. 9, No. 7, pp. 931–943 (1991), and M. Shell et al., *IEEE Photonics Technology Letters*, Vol. 8, No. 10, pp. 1391–1393 (1996). In the context of a CATV distribution network, an amplitude modulation subcarrier scheme known as AM-SCM has also been proposed. See, T. Uno et al., *OFC '94 Technical Digest*, Paper WM2, pp. 153–155 (1994).

Most frequently these prior art schemes have used multiple DFB lasers to generate the different WDM channel carriers. In some cases these lasers were directly modulated at RF rates to impose the FM or AM subcarrier channels on the optical carrier of each WDM channel. A limitation of directly modulated DFB lasers for FM-SCM is the resulting residual AM that is incurred. Therefore, a need remains in the art for a broadband wavelength tunable laser that enables WDM, AM-SCM and FM-SCM to be realized in a single device. This need is not satisfied, for example, in prior art DBR lasers and sampled grating lasers which do not provide broadband, continuous tuning around the center wavelength of each channel.

SUMMARY OF THE INVENTION

In accordance with one embodiment of our invention, a WDM fiber-optic network includes a unique laser transmitter which enables signals to be routed at three hierarchical levels: at one level discrimination among signal paths is based on N WDM wavelength channels, at another level discrimination is based on m AM subcarrier frequency channels, and at a third level discrimination is based on n FM subcarrier frequency channels. Thus, a total of Nmn distinguishable optical channels can be accommodated. In this embodiment each combination of the Nmn parameters constitutes a separate address for routing signals to Nmn users.

The laser transmitter comprises a broadband, tunable semiconductor laser which includes an intracavity, integrated composite reflector to which a tuning voltage and an FM dither signal are applied, an intracavity gain section to which drive current is applied, and an extracavity, integrated electroabsorption modulator to which an information (e.g., data, voice, video) signal and an AM dither signal are applied. The tuning voltage provides coarse wavelength tuning among N WDM channels, whereas the FM dither signal produces an additional m channels via FM-SCM. The AM dither likewise produces an additional n channels via AM-SCM.

In a preferred embodiment, the tunable laser provides an optical output signal in any one of N different longitudinal modes at wavelengths corresponding, for example, to the N channels of the WDM system. The laser comprises an MQW active region, a DFB region for selecting the nominal wavelength of stimulated emission (i.e., laser light) generated by the active region, and a first waveguide optically coupled to the active region to permit egress of the laser output signal. The tunable laser is characterized in that a composite second reflector is coupled to one end of the first waveguide so as to form a cavity resonator with the DFB region. The second reflector includes an MQW second region optically coupled to the MQW active region, a second waveguide having one end optically coupled to the first waveguide, and a high reflectivity dielectric layer disposed at the other end of the second waveguide. In order to tune the center wavelength of the laser light, the tuning voltage is applied to the MQW second region to induce changes in refractive index through the Quantum Confined Stark Effect (QCSE). In order to use FM-SCM, the FM dither signal is also applied to the MQW second region. In a similar fashion, the extracavity electroabsorption modulator also has an MQW third region optically coupled to the MQW active region of the gain section. The information signal and the AM dither signal are applied to the MQW third region in order to impress information and AM-SCM, respectively, on the carrier signals.

BRIEF DESCRIPTION OF THE DRAWINGS

Our invention, together with its various features and advantages, can be readily understood from the following more detailed description taken in conjunction with the accompanying drawing, in which:

FIG. 4 is a block diagram of a WDM optical network in accordance with another embodiment of our invention;

FIG. 5 is a schematic of an alternative channel splitting arrangement for use in the network of FIG. 4;

In the interests of simplicity and clarity, the figures have not been drawn to scale.

DETAILED DESCRIPTION OF THE INVENTION

Before addressing WDM optical networks in accordance with our invention, we will first describe a unique laser transmitter which, utilizing a single broadband, tunable laser source, enables signal routing at three hierarchical levels. At one level signal discrimination or routing is based on N WDM channels, at another level discrimination is based on m AM subcarrier frequency channels, and at a third level discrimination is based on n FM subcarrier frequency channels. Thus, the three parameters N,m and n constitute address information for each of Nmn users.

Laser Transmitter

Figure 3:
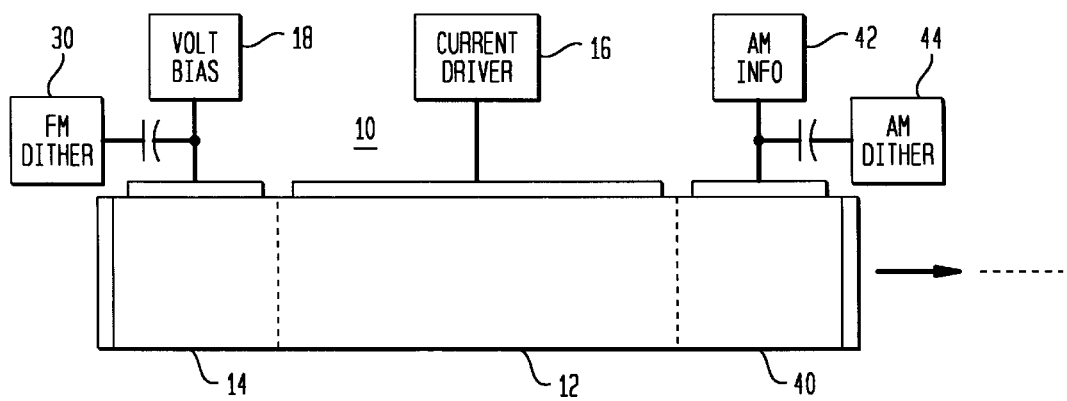
FIG. 3 is a schematic view of the laser of FIG. 1 including an integrated extracavity electroabsorption modulator 40; an FM dither signal source 30 is coupled to the composite reflector section 14 and an AM dither signal source 44 is coupled to the modulator 40.

With reference now to FIG. 3, our laser transmitter 10 comprises a broadband, tunable semiconductor laser including a gain section 12, an intracavity, integrated composite reflector section 14, and an integrated extracavity AM modulator 40, e.g., an electroabsorption modulator. This tandem arrangement of components may be viewed as an optical integrated circuit. A current driver 16 supplies current to the gain section in order to generate an output signal 20. As described more fully hereinafter, a DC voltage supplied to reflector section 14 by bias source 18 coarsely tunes the center wavelength of the output signal by controlling the phase of the optical field within the laser cavity. In this fashion the output signal is tunable across the N channels of the WDM system. Information (e.g., data, voice, video) is impressed on the output signals in the form of AM (i.e., on-off keying at, for example, gigabit rates) by means of source 42 coupled to modulator 40. An FM dither source is coupled to composite reflector 14 in order to frequency modulate the output signal at RF frequencies (e.g., 10s of kHz to 10s of MHz) and to produce n FM subcarrier channels at frequencies $f_{nj}$. Typically the FM dither signal has a much smaller amplitude (e.g., 100 mV) than the DC tuning voltage (e.g., 1–2 V). Similarly, the amplitude of the wavelength variations introduced by the FM-SCM will be much less than the WDM channel spacing. An AM dither source 44 is coupled to modulator 40 to amplitude modulate the output signal at RF frequencies (e.g., 10s of kHz to 10s of MHz) to produce m AM subcarrier channels at frequencies $f_{mj}$. Typically the AM dither signal also has a relatively small amplitude (e.g., 10s of mV) compared to the amplitude of the electrical data signal for on-off keying (e.g., 2–4 V). Similarly, the amplitude of the AM-SCM signal will be much less than the amplitude of the on-off keyed optical data signal. Note that the AM and FM subcarrier routing information could be contained solely in the address header in a packet-based network.

When the transmitter 10 is incorporated in an optical network, it provides Nmn channels, and the network discriminates (or selects) among the various channels in order to provide service to Nmn different users. As used herein, the term user is intended to embrace a wide variety of customers served (e.g., including actual end users) as well as myriad portions of a network (e.g., including systems nodes, terminal equipment, etc.)

Three-Level Optical Routing Network

FIG. 4 illustrates such a network in accordance with one embodiment of our invention. In order to follow the operation of the network, we will illustrate how a signal is routed to a particular user 4 who is identified by three parameters: ($\lambda_i$, $f_{mj}$, $f_{nj}$), corresponding, respectively, to the (W)M channel wavelength (i=1,2 . . . N), the AM subcarrier channel frequency (mj=m1,m2 . . . mm) and the FM subcarrier channel frequency (nj=n1,n2 . . . nn) assigned to that user. The network includes a laser transmitter 10 of the type described above with reference to FIG. 3 and below with reference to FIGS. 1 and 2. The laser might be located, for example, at the central office of a telecommunication system. The network also has three subsystems 1, 2 and 3 which provide three levels or hierarchies of routing. In the first subsystem 1 a power splitter 1.1 broadcasts the signal 20 from transmitter 10 onto N optical paths. Thus, discrimination is based on WDM wavelength channels and is implemented using optical filters 1.2. The optical signal $\lambda_i$ filtered from subsystem 1 is transmitted to subsystem 2 where power splitter 2.1 broadcasts the incoming signal onto m optical paths. Selectivity or discrimination at this level is based on AM subcarrier channels and is implemented by means of filters 2.2. The $f_{mj}$ filter 2.2 is shown schematically as including an optical tap 2.3 for coupling a small portion of the signal from splitter 2.1 to an electro-optic transducer depicted illustratively as a photodiode 2.4. However, the principal portion of the signal is transmitted to an optical switch 2.5 which is actuated by controller 2.6. The latter is responsive to the output of RF filter 2.7 which receives its input from photodiode 2.4. The RF filter on each path from splitter 2.1 is set to transmit a different AM subcarrier frequency. If the output of RF filter 2.7 exceeds a threshold level, the optical switch 2.5 will be closed so that the signal from subsystem 2 is transmitted to subsystem 3. Routing at the subsystem 3 level is based on the FM subcarrier channels. At this stage, the FM dither on the signal is converted to an AM dither by an FM-to-AM converter 3.8 before the signal is transmitted to power splitter 3.1. The latter broadcasts the signal onto n optical paths where discrimination or selectivity is implemented using filters 3.2. The $f_{nj}$ filter 3.2 is shown schematically as including an electro-optic transducer (depicted illustratively as a photodiode 3.4) which converts the incoming signal from splitter 3.1 to an electrical signal delivered to RF filter 3.7. The RF filters on the optical paths at this level are each tuned to transmit a different FM subcarrier frequency ($f_{nj}$ in the case of user 4); i.e., the output of filter 3.7 is coupled to user 4. In this fashion, a signal from transmitter 10 may be routed through three system levels to any one of Nmn users.

The FM-to-AM converter 3.8 may be any of several well-known optical devices such as, for example, an unbalanced Mach-Zender interferometer or a biconic taper filter. In addition, the FM-to-AM conversion function may alternatively be performed after the signal is broadcast by splitter 3.1, but this design would require additional equipment in the form of a separate converter in each broadcast path.

An alternative design of the first subsystem 1 is shown in FIG. 5. The signal 20 from laser 10 is coupled to a tandem arrangement of three-port optical circulators 5.1. The signal 20 is coupled to the input port of the first circulator 5.1. An optical filter 5.2 (e.g., a fiber grating) coupled to one output port of the circulator 5.1, reflects the first channel wavelength $\lambda_1$ but transmits all other channel wavelengths. The latter are transmitted to the next circulator, where the filtering process (sometimes referred to as channel dropping) is repeated. In contrast, the signal at $\lambda_1$ is coupled from the other output port of circulator 5.1 onto a separate path. In this way all of the various WDM channels are separated onto different paths. Note that for the case of many WDM channels, it may be desirable to separate wavelengths using a phased array router.

In addition, it may be desirable in some applications to interchange the order of the three subsystems. For example the order of subsystems 1 (WDM channel routing) and subsystem 2 (AM subcarrier routing) may be interchanged.

WDM/TDM Optical Network

In this embodiment, N users are addressed sequentially and data is supplied to each user continuously, rather than in bursts (e.g., packets) characteristic of prior art packet transmission systems. In this application user channels are switched after every bit period (i.e., bit interval $\tau$).

Figure 6:
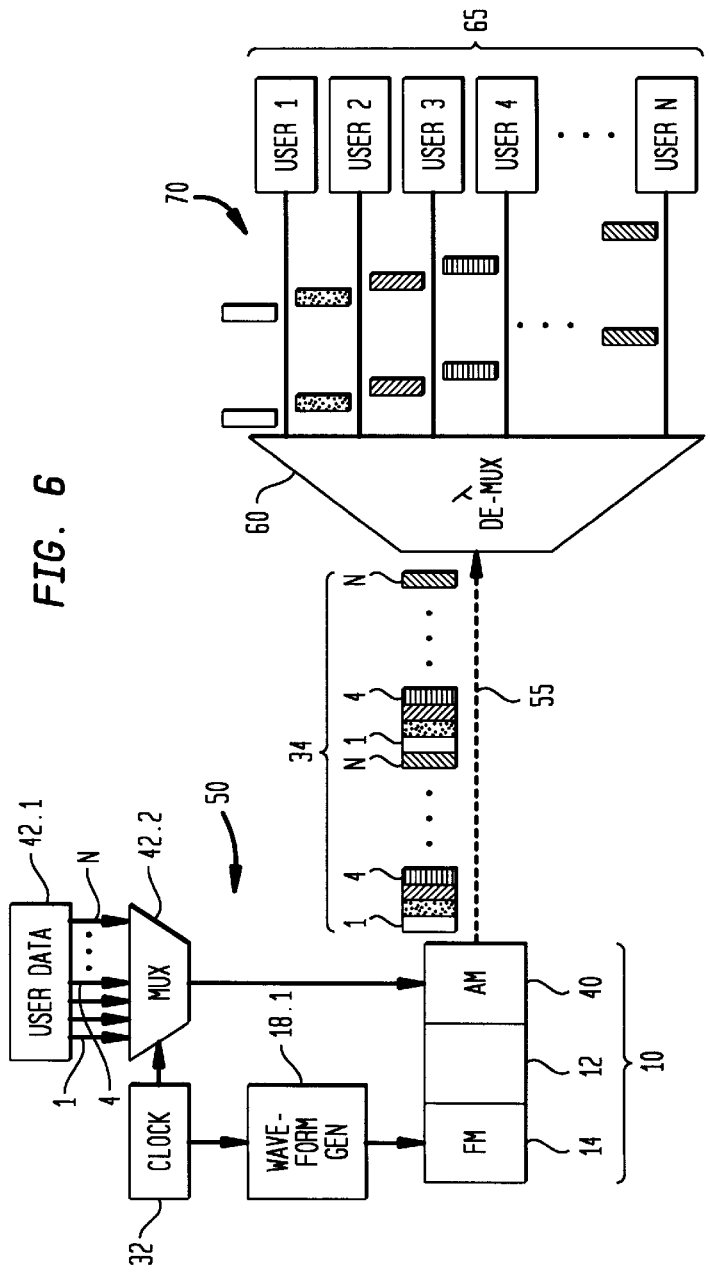
FIG. 6 is a block diagram of a WDM/TDM optical network in accordance with yet another embodiment of our invention.

More specifically, FIG. 6 illustrates a WDM/TDM network which includes laser transmitter 50 for generating a digital output signal 34 which is coupled to a distribution arrangement 70 via a transmission medium 55. The transmitter 50 includes broadband, tunable laser source 10, a waveform generator 18.1 coupled to the composite reflector section 14, and a user data or information source 42.1 coupled through an electronic multiplexer 42.2 to AM modulator section 40. A clock 32 synchronizes the generator 18.1 and the multiplexer 42.2.

Figure 8:
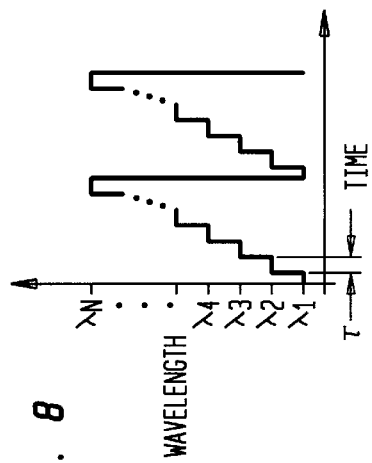
FIG. 8 depicts how the center wavelength of the laser source changes in response to the tuning voltage waveform of FIG. 7.
Figure 7:
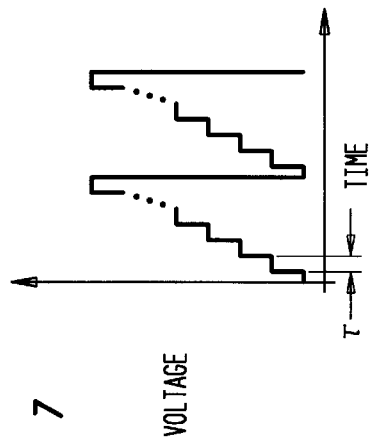
FIG. 7 depicts an illustrative staircase tuning voltage generated by waveform generator 18.1 and applied to composite reflector section 14.

The waveform generator 18.1 supplies a staircase voltage (e.g., the voltage waveform of FIG. 7) to the composite reflector section 14 in order to tune the center wavelength of the source 10 over N channels as shown in FIG. 8. It is important that the wavelength is changed on the timescale of a bit period; e.g., once every bit period. The N channels identify N end users who receive the signal transmitted over the medium 55 to distribution arrangement 70. The latter includes a wavelength demultiplexer 60 (e.g., a well known phased array router) which has N output paths coupled separately to each of N users 65.

A TDM scheme is used to provide data to the users continuously at a bit rate which is 1/N times the aggregate system rate; i.e., at $1/(N\tau)$. For example, in a 10 Gb/s system $\tau=100$ ps and if there are N=20 users (or channel wavelengths), each user has effectively a 500 Mb/s bandwidth. The ability to switch between channels requires that the laser source 10 be able to change its center wavelength on the timescale of a bit period (e.g., shorter than 100 ps in this illustration). Our broadband, tunable laser source readily satisfies this requirement, being capable of switching its center wavelength in times as short as about 50 ps, as discussed infra. On the other hand, in a 10 Gb/s prior art packet switching system, the user would receive bursts of 10 Gb/s data followed by an idle period. In this case, the user would require a high speed, burst mode receiver to extract the data. In contrast, in the bit-interleaving TDM scheme in accordance with our invention, each user receives data continuously at a sub rate of the aggregate 10 Gb/s rate. Hence, no high speed, specialized receiver is required to extract the data.

The AM modulator section 40 of the laser source 10 is used concurrently with staircase waveform generator 18.1 to impose data or information onto each user wavelength by intensity modulation (i.e., by on-off keying) to generate a sequence of pulses or bits of duration $\tau$, thus forming a digital signal having a bit rate $1/\tau$. The bandwidth requirements for the AM modulator are the same as those for the FM section (i.e., the composite reflector 14); that is, both switch at the same rate.

Broadband Tuning

Figure 1:
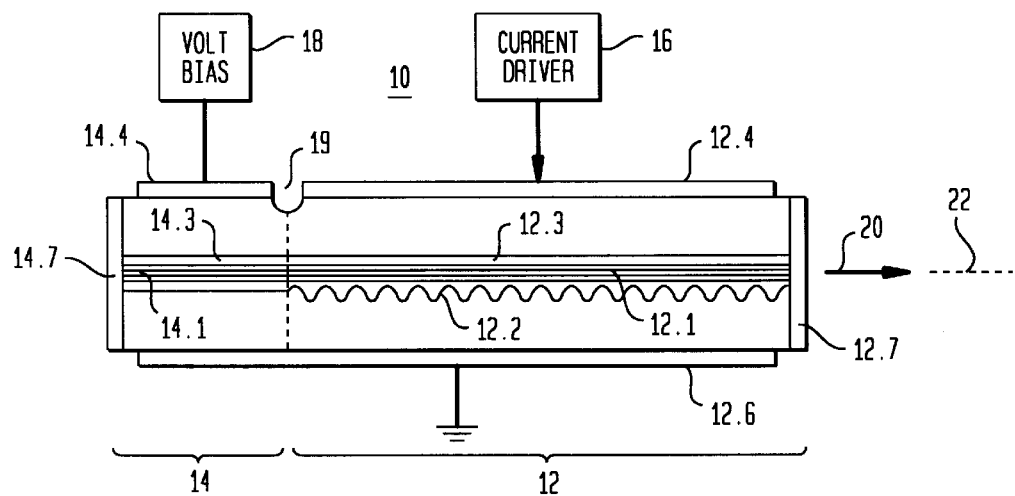
FIG. 1 is a schematic cross-sectional view of a tunable semiconductor laser in accordance with one embodiment of our invention.
Figure 2:
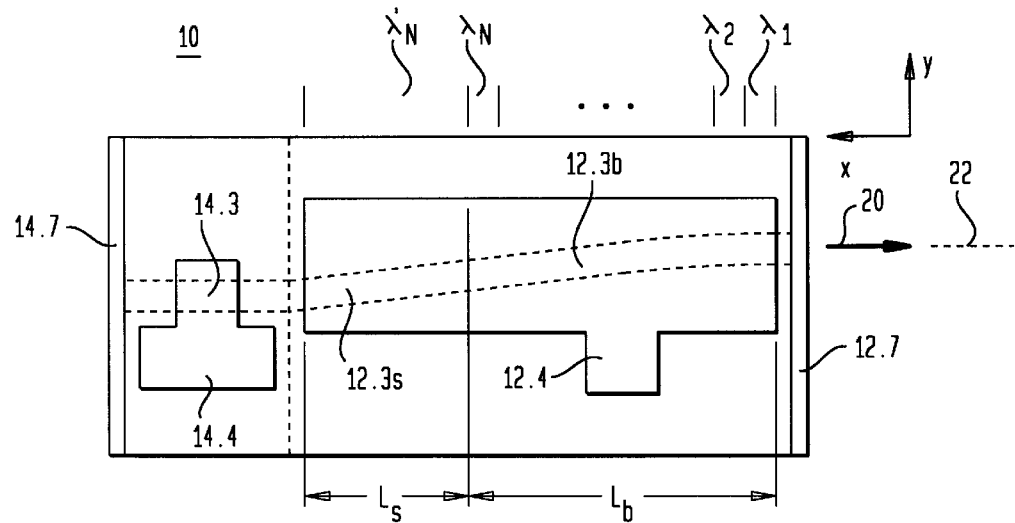
FIG. 2 is a schematic top view of the laser of FIG. 1.

Turning now to FIGS. 1 and 2, we describe in greater detail the structure and operation of the broadband, tunable laser source 10 of FIG. 3. For simplicity, however, the modulator 40 has been omitted from the following discussion. More specifically, the source 10 generates an optical output signal 20 in any one of a plurality of N longitudinal modes each having a different wavelength $\tau_i$ (i=1,2, ... N). The output signal 20 propagates along a transmission axis 22 of, for example, a WDM system (not shown). The systems contemplated may embrace low speed applications (e.g., infrequent network reconfigurations) as well as relatively high speed applications (e.g., optical packet switching). In any case, the tunable source 10 comprises a cavity resonator formed by a gain section 12 and a composite reflector section 14.

The gain section 12 includes a relatively wide effective bandgap MQW active region 12.1, a DFB region 12.2 comprising a uniform pitch grating optically coupled to the active region, and a relatively narrower bandgap first waveguide 12.3 optically coupled to the active region. The output of the waveguide 12.3 is coupled to transmission axis 22 through a relatively low reflectivity dielectric layer (or composite of layers; e.g., an AR coating) 12.7. When current driver 16 supplies above-threshold forward bias current to the active region via electrodes 12.4 and 12.6, the laser source 10 generates light (radiation) at a wavelength determined by the composition and gain spectrum of the MQW region. In the absence of tuning mechanisms, the pitch of the DFB grating determines which longitudinal mode within the gain spectrum is selected. This mode is coupled into the first waveguide 12.3 and provides the laser output 20. As discussed later, any one of a plurality of N longitudinal modes at different wavelengths can be selected by modifying the laser design in accordance with various aspects of our invention.

In one aspect, the laser source 10 is provided with the composite reflector section 14 which, as indicated above, forms a cavity resonator with the gain section 12 (i.e., with the DFB region 12.2). More specifically, section 14 includes an MQW second region 14.1 optically coupled to the MQW active region 12.1, a second waveguide 14.3 having one end optically coupled to the first waveguide 12.3, and a relatively high reflectivity dielectric layer (or composite of layers; e.g., an HR coating) 14.7 disposed at the other end of the second waveguide 14.3.

In a second aspect shown in FIG. 2, the laser source 10 is provided with a first waveguide 12.3 having a predetermined shape (e.g., a raised-sine shape) which effectively segments the portion 12.3b of the waveguide 12.3 (i.e., the portion under electrode 12.4) into N zones corresponding to the N different wavelengths of WDM system (i.e., the channel wavelengths). These zones, labeled $\tau_i$ (i=1,2 ... N) in FIG. 2, each provide optical feedback at a different wavelength because the waveguide 12.3b has a different slope (i.e., relative to the grating lines) within each zone. However, continuous tuning over the range $\tau_1$ to $\tau_N$ is possible only if all of the longitudinal modes corresponding to these wavelengths have essentially the same threshold gains. This desideratum is achieved by a combination of the shape of the waveguide 12.3b (which determines the flatness of the gain spectrum of the modes) and the drive current (which determines the gain of the MQW active region 12.1). In addition, modes corresponding to zones in which the waveguide slope is larger experience higher loss. To compensate for the higher loss in the longest wavelength zone $\tau_N$, which has the highest waveguide slope, the waveguide 12.3 is provided with a straight (i.e., linear) portion 12.3s disposed between the shaped portion 12.3b and the second waveguide 14.3 of the composite reflector section 14. Since the electrode 12.4 overlaps the portion 12.3s, the Nth mode is provided with additional gain to offset the higher losses (i.e., the zone for the Nth mode includes not only the region labeled $\tau_N$ under electrode 12.3b in FIG. 2, but also the region labeled $\tau_N$ under electrode 12.3s).

The shape y(x) of the waveguide portions 12.3b and 12.3s and their corresponding grating pitch functions $\Lambda(x)$ can be described by a set of equations as follows. In the range $L_S \leq x \leq L_B$ the shape of the waveguide 12.3b follows essentially a raised-sine shape given by $$y_b = W + (W/L_b)(2L_s - x) + (W/\pi)\sin(\pi x/L_b) \quad (1)$$

where x is distance along the direction of light propagation (e.g., along transmission axis 22), W is the maximum displacement of y(x) from axis 22 in the case where the straight portion 12.3s is omitted, $L_s$ is the length of the straight waveguide portion 12.3s, and $L_b$ is the length of the shaped waveguide portion 12.3b. The corresponding grating pitch is given by $$\Lambda_b = \Lambda_0[1 + (W/L_b)^2(\cos\pi x/L_b - 1)^2]^{1/2} \quad (2)$$

where $\Lambda_0$ is the pitch of the uniform grating of the DFB region 12.2. In contrast, in the range $L_b \leq x \leq (L_b + L_s)$ the shape of the waveguide 12.3s follows a straight line function given by $$y_s = 2W + (2W/L_b)(L_s - x) \quad (3)$$

whereas the grating pitch is given by $$\Lambda_s = \Lambda_0[1 + (2W/L_b)^2]^{1/2}. \quad (4)$$

Although the combination of a raised-sine function and a straight line function for the two waveguide segments is preferred, other functions can be utilized depending on the particular application contemplated.

In a third aspect of our invention, the laser source 10 is provided with means for applying an electrical control signal to the composite reflector section 14 which effectively alters the phase of light propagating in the second waveguide 14.3 and hence in the laser source as a whole. Illustratively, an electrical signal from source 18 is applied to section 14 via electrodes 14.4 and 12.6. The signal may take on several forms (i.e., current or voltage), but is preferably a reverse bias voltage which induces the Quantum Confined Stark Effect (QCSE) in the MQW second region 14.3. The QCSE, in turn, induces changes in the refractive index of the MQW region 14.3 and hence in the phase of the light propagating in the second waveguide 14.3. Therefore, by varying the applied voltage the laser source 10 can be tuned over a relatively broad range of wavelengths corresponding to the wavelengths spanned by the N zones of the first waveguide 12.3.

In general, varying only a single parameter, such as the control voltage level applied to the composite reflector section 14 enables the wavelength of the laser source to be tuned over a moderately broad range (e.g., about 2 nm) at relatively high speeds (e.g., 50–100 ps). However, varying several parameters, such as the control voltage level, the drive current and the temperature of the laser, enables tuning over a much broader wavelength range (e.g., 10–12 nm), albeit at more modest speeds (e.g., in the millisecond to nanosecond range).

The following examples demonstrate the efficacy of our invention for both relatively low speed and relatively high speed applications. The various materials, dimensions, operating conditions and other parameters are provided by way of illustration only, and are not to be construed as limitations on the scope of the invention unless expressly so indicated.

Example II: Low Speed Tuning

A laser source 10 was fabricated using selective area growth MOVPE to grow the various semiconductor layers and standard processing to etch shapes, deposit electrodes and the like. The MQW regions 12.3 and 14.3 comprised 7 layers of strained InGaAsP (1.55 μm bandgap) interleaved with barrier layers of InGaAsP (1.28 μm bandgap). Transverse mode control was accomplished by forming a 1 μm wide well-known CMBH structure. InP:Fe current blocking layers 3 μm thick were formed on either side of the CMBH structure in order to reduce leakage current and parasitic capacitance. A shallow groove 19 about 80 μm long was used to enhance electrical isolation with a typical resistance of 25 kΩ. The waveguides 12.3b and 12.3s had shapes defined essentially by equations (1) and (3) above and were designed to provide gain in eight longitudinal modes corresponding to eight channels (each about 1.4 nm wide) of a WDM system at wavelengths ranging from 1549.4 to 1560.7 nm.

We were able to tune the laser source through all eight channels (over more than an 11 nm range) by appropriate choice of bias voltage, drive current and temperature. The typical power delivered into a single mode fiber was 10 mW at a drive current of 60 mA. The mean side mode suppression ratio was about 36 dB. The following table illustrates how the three parameters were varied to achieve tuning over a relatively broad 11 nm range.

| CHANNEL NO. | WAVELENGTH (nm) | TEMPERATURE (° C.) | BIAS VOLTAGE (V) | DRIVE CURRENT (mA) |
|---|---|---|---|---|
| 1 | 1549.42 | 25 | −1.80 | 60 |
| 2 | 1551.02 | 25 | 0.00 | 60 |
| 3 | 1552.63 | 25 | 0.00 | 70 |
| 4 | 1554.25 | 25 | 1.10 | 170 |
| 5 | 1555.86 | 25 | 1.73 | 320 |
| 6 | 1557.47 | 35 | 1.67 | 300 |
| 7 | 1559.09 | 45 | 2.30 | 290 |
| 8 | 1560.72 | 50 | 2.40 | 290 |

This low speed tuning range of 11 nm is more than double the best result reported in the prior art (Cf, H. Hillmer et al., *IEEE J. Selected Topics in Quantum Electronics*, Vol. 1, No. 2, pp. 356–362 (1995); incorporated herein by reference).

Example III: High Speed Tuning

A laser source similar to the one described in Example II was utilized to demonstrate single parameter, high speed tuning over a relatively broad wavelength range. The single parameter varied was the bias voltage applied to the composite reflector section 14. When driven with a bias voltage having a 350 ps, period the laser output tuned back and forth between high (1551.7 nm) and low (1550.0 nm) wavelengths at the same rate. The output switched from short to long wavelength over a 1.7 nm range in 56 ps and switched back in 134 ps (10% to 90% rise time). The side mode suppression ratio was about 35 dB during tuning. This high speed tuning range is nearly an order of magnitude better than that previously reported by the prior art (Cf., H. Nakajima et al, *OFC Technical Digest*, p. 276 (1996); incorporated herein by reference). High speed switching between four channels (channel spacing 0.7 nm) was also demonstrated using a 4-level bias voltage. The ability of our tunable laser source to address multiple WDM channels and to switch between them at very high speeds should enable optical routing on a cell-by-cell basis in a WDM network without requiring large guard times. In addition, this rapid wavelength switching capability allows high speed, bit-interleaved TDM as described supra.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. For example, in long distance transmission systems a narrow linewidth laser source is particularly important because fiber dispersion tends to increase pulse width. But, spatial hole burning in the laser, which can be caused by non-uniform current drive, tends to increase linewidth. Therefore, it is particularly advantageous that the drive current be applied substantially uniformly to the MQW active region 12.1. To this end, it is preferable that the electrode 12.4 be a single, non-segmented electrode and, likewise, that the active region 12.1 be a single, non-segmented region. By employing these features in our invention we were able to obtain linewidths of 1–2 MHz, which we expect would be an order of magnitude improvement compared to prior art segmented designs (Cf, Hillmer et al. and Nakajima et al., supra).

What is claimed is:

1. A laser transmitter for use in an Nmn-channel system, comprising
    a tunable laser source for delivering an optical output signal in any one of N different longitudinal modes, said source including
        a gain section including an MQW active region, a DFB region optically coupled to said active region for selecting the nominal wavelength of the longitudinal mode which lases, and a first waveguide optically coupled to said active region to permit egress of the laser output signal,
        a composite reflector optically coupled to one end of said first waveguide so as to form a cavity resonator with said DFB region, said composite reflector including an MQW second region optically coupled to said MQW active region, a second waveguide having one end optically coupled to said first waveguide, and a relatively high reflectivity dielectric layer disposed at the other end of said second waveguide,
        tuner means for applying a tuning voltage to said MQW second region to induce therein a quantum confined stark effect, thereby to alter the center wavelength of said output signal across N WDM channels, and
        driver means for applying drive current to said active region,
        the current applied to said active region and the shape of said first waveguide being mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes, and
    a modulator integrated with said gain section for amplitude modulating said output signal,
    an information source coupled to said modulator for modulating the amplitude of said output signal in accordance with said information,
    an AM dither source for applying to said modulator a relatively low frequency first dither signal, thereby to generate m AM subcarrier channels, and
    an FM dither source for applying to said composite reflector a relatively low frequency second dither signal, thereby to generate n FM subcarrier channels.

2. The invention of claim 1 wherein said dither signals each have a frequency in the range of RF frequencies.

3. The invention of claim 1 wherein said modulator comprises an electroabsorption modulator.

4. The invention of claim 3 wherein said modulator includes and MQW third region integrally coupled to said MQW active region.

5. The invention of claim 1 wherein said N channels span a wavelength range from about 1549 nm to 1561 nm and said laser source is continuously tunable over said range.

6. The invention of claim 1 wherein said first portion has a raised-sine function of the form defined by equation (1).

7. The invention of claim 1 wherein said active region is a single, non-segmented region and further including a single, non-segmented electrode for applying said drive current thereto in a substantially uniform manner.

8. An Nmn-channel WDM optical system comprising
    an optical network for routing an optical signal to any one of Nmn users,
    a tunable laser source coupled to said network for providing an optical output signal in any one of N different longitudinal modes corresponding to N channels of said WDM system, said source including
        a gain section comprising a single, non-segmented InGaAsP MQW active region, a DFB region optically coupled to said active region, said DFB region including a grating of uniform pitch for selecting the nominal wavelength of the longitudinal mode which lases, a first InGaAsP waveguide optically coupled to said active region, and a relatively low reflectivity first dielectric reflector coupled to one end of said first waveguide to permit egress of said laser output signal,
        a composite reflector optically coupled to the other end of said first waveguide so as to form a cavity resonator with said DFB region, said composite reflector including an InGaAsP MQW second region optically coupled to said MQW active region, a second InGaAsP waveguide having one end optically coupled to said first waveguide, and a relatively high reflectivity second dielectric reflector optically coupled to the other end of said second waveguide,
        said first waveguide including a first portion and a second portion optically coupling said first portion to said composite reflector, the shape of said first portion corresponding essentially to the raised-sine function of equation (1) and the shape of said second portion corresponding essentially to the straight line function of equation (3), and tuner means for applying voltage to said MQW second region to induce therein a quantum confined stark effect, thereby to tune the center wavelength of said output signal across said N channels, and driver means for applying drive current to at least those sections of said active region optically coupled to said first waveguide, said driver means comprising a single, non-segmented electrode for applying current to said active region in a substantially uniform manner, wherein said current applied to said active region and the shape of said first waveguide are mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes and a different one said N channels, an electroabsorption modulator integrated with said laser for amplitude modulating said output signal, an information source coupled to said modulator for modulating the amplitude of said output signal in accordance with said information, an AM dither source for applying to said modulator a relatively low frequency first dither signal, thereby to generate m AM subcarrier channels in said output signal, and an FM dither source for applying to said composite reflector a relatively low frequency second dither signal, thereby to generate n FM subcarrier channels in said output signal.

9. The invention of claim 8 wherein said N channels span a wavelength range from about 1549 nm to 1561 nm and said laser source is continuously tunable over said range.

10. An optical system comprising an optical network for routing an optical signal to any one of Nmn users, an integrated optical circuit for generating a modulated, tunable laser output signal coupled to said network, said circuit including, arranged in tandem, a tunable semiconductor laser source for generating said output signal and a semiconductor modulator for impressing information on said output signal, said laser source including a cavity resonator formed by a DFB gain section for generating said laser signal at a given center wavelength and a composite reflector for altering the phase of the laser signal within said resonator, a tuning source for applying a tuning voltage to said composite reflector to alter said phase and hence tune the center wavelength of said output signal across said N channels, an information source coupled to said modulator for modulating the amplitude of said output signal in accordance with said information, an AM dither source for applying to said modulator a relatively low frequency first dither signal, thereby to generate m AM subcarrier channels in said output signal, and an FM dither source for applying to said composite reflector a relatively low frequency second dither signal, thereby to generate n FM subcarrier channels in said output signal.

11. The invention of claim 10 wherein said dither signals have frequencies in the range of RF frequencies.

12. The invention of claim 11 wherein said network comprises a first subsystem including means for broadcasting said output signal onto a plurality of N optical first paths and an optical filter associated with each of said first paths for transmitting a selected one of said N channels, a second subsystem including means for broadcasting the signal on each of said first paths onto m optical second paths and a first RF filter associated with each of said second paths for transmitting a selected one of said m AM subcarrier channels, and a third subsystem including means for broadcasting the signal on each of said second paths onto n optical third paths and a second RF filter associated with each of said third paths for transmitting a selected one of said n FM subcarrier channels to a predetermined one of said users.

13. The invention of claim 12 further including a converter for converting to AM dither the FM dither on the signals transmitted from said second subsystem to said third subsystem.

14. The invention of claim 12 wherein said second subsystem further includes, associated with each of said second paths, an optical switch and a controller responsive to said first RF filter for closing said switch and thereby allowing signals to be transmitted from said second subsystem to said third subsystem.

15. An optical transmitter for transmitting digital optical signals to N users each assigned to a separate one of N wavelength channels, comprising a broadband, tunable laser source for generating said signals, said source being capable of altering its center wavelength on the timescale of a bit interval of said digital signal in response to a tuning signal, said source including an integrated modulator for impressing information onto said digital signals, a tuning source for applying a staircase tuning signal to said source so as to tune said center wavelength across said N channels, said center wavelength being tuned on the timescale of said bit period, and an information source coupled to said modulator for impressing information on said signals during each bit period and synchronously with said tuning signal, so that a particular users' information is coupled to said modulator only when said laser source is tuned to that user's channel.

16. The invention of claim 15 wherein said laser source includes a cavity resonator formed by a DFB gain section for generating any one of said signals at a given center wavelength and a composite reflector for altering the phase of said signal within said resonator, and wherein said tuning signal comprises a tuning voltage applied to said composite reflector.

17. The invention of claim 15 wherein said bits have a duration $\tau$ and the steps of said staircase signal repeat at a rate of essentially $1/N\tau$.

18. A digital optical system comprising an optical network for routing said signals to any one of said N users, a transmitter according to claim 15, and a wavelength demultiplexer for distributing said signals to each of said N users according to the wavelength of the channel assigned to each of said users.

* * * * *